United States Patent
House et al.

(10) Patent No.: US 7,254,514 B2
(45) Date of Patent: *Aug. 7, 2007

(54) METHOD AND SYSTEM FOR PREDICTING REMAINING LIFE FOR MOTORS FEATURING ON-LINE INSULATION CONDITION MONITOR

(75) Inventors: Michael Brynn House, Laurel, MD (US); Greg Flickinger, Pittsburgh, PA (US); Gary James Chmiel, Ballston Spa, NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/908,455

(22) Filed: May 12, 2005

(65) Prior Publication Data

US 2006/0259271 A1    Nov. 16, 2006

(51) Int. Cl.
*G06F 19/00* (2006.01)

(52) U.S. Cl. ............... 702/181; 702/183; 702/185; 702/182; 318/565

(58) Field of Classification Search ............... 702/181, 702/183, 34–36, 56, 58, 59, 64, 65, 113, 122, 702/179, 182, 185, 187, 188
See application file for complete search history.

(56) References Cited

U.S. PATENT DOCUMENTS

| | | | |
|---|---|---|---|
| 4,525,763 A | 6/1985 | Hardy et al. | 361/24 |
| 5,841,260 A * | 11/1998 | Imai | 318/638 |
| 6,035,265 A | 3/2000 | Dister et al. | 702/183 |
| 6,834,256 B2 | 12/2004 | House et al. | 702/181 |
| 7,042,229 B2 * | 5/2006 | Lee et al. | 324/551 |
| 2004/0044499 A1 | 3/2004 | House et al. | 702/181 |
| 2005/0033557 A1 | 2/2005 | House et al. | 702/184 |
| 2005/0218906 A1 * | 10/2005 | Younsi et al. | 324/551 |

OTHER PUBLICATIONS

PCT Search Report for Application GB0609375.1, 3 pages.

* cited by examiner

*Primary Examiner*—Hal Wachsman
(74) *Attorney, Agent, or Firm*—Cantor Colburn LLP

(57) ABSTRACT

A method and a system for determining a remaining time before failure of a motor system are provided. The method and the system determine the remaining time before failure based on historical motor data and operational parameter data associated with the motor system.

16 Claims, 6 Drawing Sheets

METHOD AND SYSTEM FOR PREDICTING REMAINING LIFE FOR MOTORS FEATURING ON-LINE INSULATION CONDITION MONITOR

BACKGROUND OF THE INVENTION

The present invention relates to a system and method for determining reliability and forecasting, with an ascertained statistical confidence, a remaining time before failure for electric motor systems including an insulation condition monitor.

Acquisition of accurate information concerning the running condition, status and performance of motor systems, such as, for example, electric motors used in "critical" industrial manufacturing processes, power generation systems and the like, is often crucial in maintaining successful commercial operation of such systems. Consequently, considerable efforts are often expended to develop and improve upon existing methods and apparatuses used for monitoring and assessing the operation and performance of electric motors and coil devices in such systems. Robust methods of inspection are often desired for such critical process motors, since if a motor must be taken off-line, its inoperability may adversely impact production and manufacturing processes or other revenue generating capacity.

Robust processes for the inspection and predictive maintenance of motor systems usually involve monitoring a variety of operational parameters such as motor current, voltage, vibration, flux leakage, etc. to detect impending failures. Conventionally, one or more parameters are monitored over time and used to trigger a maintenance outage/recommendation when the value of a monitored parameter exceeds a predetermined threshold. The contemporary technological trend is to automate the inspection process by affixing a variety of sensors and transducers to critical process motors to continuously collect information through either off-line monitoring or on-line monitoring techniques. Parameter data for an operating motor may then be tracked continuously and an alarm may be immediately triggered if a predetermined threshold value for a particular parameter is exceeded. For example, vibration amplitude or spectral data that exceeds or drifts from a predetermined range or value can be used to activate an alarm to notify the equipment operator that a particular type of failure mode is imminent. Unfortunately, these conventional inspection and predictive maintenance processes typically target only imminent failures and do not provide a quantitative determination of remaining motor life or motor reliability.

In general, service and repair information acquired as a result of previous inspections and routine maintenance of motor equipment is not compiled for the purpose of performing predictive/prognostic maintenance or conducting a comprehensive analysis of motor health. Conventionally, a motor system expert/specialist simply assesses available historical information and then formulates a maintenance recommendation based on obvious trends and personal experience. A decision to repair or perform maintenance on a particular motor system was based on an estimate of the reliability and usability of the equipment developed primarily from the expert's subjective judgment. In other instances, preventive maintenance is based solely on the number of hours of motor operation or the time since the last maintenance outage, rather than on any condition-based test results. Moreover, even if it was desirable for a motor operator/technician or monitoring specialist to collect test data or parametric operating data from a particular motor system for performing a more detailed analysis, access to conventional digital land line communications for uploading such data is often not available at the motor system site.

The use of motor operational parameter data as a failure predictive tool and to assess motor health has been explored to some extent in the past by various investigators. Different motor system parameters may be used for this purpose and may include motor system "unbalances" such as negative sequence currents, and voltage mismatch. In one example, the Fast Fourier Transform (FFT) signature of motor current was shown capable of detecting motor bearing failures. In another example, an algorithm for performing cluster analysis on the motor supply current FFT was investigated in the hopes of predicting motor life uncertainty. However, most known conventional methods provide only a general warning of imminent motor failure based on the detection of an alarm condition from a single monitored parameter. Typically, such methods do not provide an assessment of motor reliability, nor do they provide an estimate of the operating time remaining until a repair will be needed.

Given the problems discussed above, it is desirable to design a method and system capable of gathering and analyzing on-line motor parameters. It is also desirable to provide cost effective methods for transmitting motor parameters between a motor system and a local area network. Additionally, it is desirable to develop a method and system capable of gathering and analyzing on-line motor parameters that enable a prediction of motor reliability and estimated operating time until a repair will be needed based on an insulation condition of the motor system.

BRIEF DESCRIPTION OF THE INVENTION

Exemplary embodiments of the invention include a method for determining reliability and a remaining time before failure with statistical confidence for a motor system. The method includes acquiring historical motor data in a computer system, obtaining operational parameter data, uploading the operational parameter data to the computer system, performing failure analysis, developing a causal network, and performing an integrated causal network and reliability analysis of the motor system. The historical motor data corresponds to the motor system. The operational parameter data is obtained from sensors at the motor system. The sensors include a tan delta sensor. The failure analysis is performed based on a composite of reliability probability distributions corresponding to predetermined sub-populations of historical motor system failure causes. The causal network is developed for modeling reliability of one or more motor system components and assessing motor system component condition based on the causal network. Results from the performing failure analysis are integrated with results from the assessing motor system component condition based on the causal network to compute a quantitative value for a time remaining before failure with an ascertained statistical confidence.

Further exemplary embodiments of the invention include a method for assessing reliability and determining, with a statistical degree of confidence, a quantitative value for time remaining before failure for an electric motor system. The method includes storing motor system component failure data in a computer data base, the motor system component failure data including leakage current data, performing a motor system fault-tree analysis based on the motor system component failure data, the fault-tree analysis including insulation degradation based on the leakage current data, developing a motor system component fault model based on the motor system fault-tree analysis, modeling historical failure data of motor system components using a probability distribution function, developing a directed causal inference model and selecting system variables used for collecting data based on the causal inference model, developing a conditional probability matrix comprising failure probability corresponding to possible failure events for the motor system, developing an overall motor system reliability model based on the causal interference model and the conditional probability matrix, and computing a statistical assessment of reliability of the motor system and a qualitative value for time remaining before failure using the overall motor system reliability model.

Still further exemplary embodiments of the invention include a system for determining reliability and a remaining time before failure with statistical confidence for a motor system. The system comprises a tan delta sensor disposed in electrical communication with the motor system to access data of the motor system, a computer, and a transmission network in communication with the computer and the tan delta sensor configured to communicate the data from the tan delta sensor to the computer. The computer comprises a storage medium. The storage medium is readable by a processing circuit and stores instructions for execution by the processing circuit for acquiring historical motor data in a computer system, obtaining operational parameter data, uploading the operational parameter data to the computer system, performing failure analysis, developing a causal network, and performing an integrated causal network and reliability analysis of the motor system. The historical motor data corresponds to the motor system. The operational parameter data is obtained from sensors at the motor system. The sensors include a tan delta sensor. The failure analysis is performed based on a composite of reliability probability distributions corresponding to predetermined sub-populations of historical motor system failure causes. The causal network is developed for modeling reliability of one or more motor system components and assessing motor system component condition based on the causal network. Results from the performing failure analysis are integrated with results from the assessing motor system component condition based on the causal network to compute a quantitative value for a time remaining before failure with an ascertained statistical confidence.

The above, and other objects, features and advantages of the present invention will become apparent from the following description read in conjunction with the accompanying drawings, in which like reference numerals designate the same elements.

BRIEF DESCRIPTION OF THE DRAWINGS

Referring now to the drawings wherein like elements are numbered alike in the several FIGS.

DETAILED DESCRIPTION OF THE INVENTION

Industrial and power generation motors are often supplied and installed with sensors to indicate running conditions for the purpose of trending sensor data and planning maintenance procedures. Sensors are either configured to provide online or offline testing of an electric motor. Online testing has advantages over offline testing due to an ease of data acquisition and an ability to avoid downtime of the electric motor. Sensors used for online testing are configured to acquire operational parameters of the electric motor. The operational parameters include, for example, voltage, current, phase, frequency, total vibration amplitude, torque and slip.

A method has been designed for forecasting both the failure mode and the remaining life in electric motors, based on sensor inputs including the operational parameters. The method incorporates a large database of inspection information and industry standard data utilized for a probabilistic analysis of the sensor inputs and a causal network, e.g. a Bayesian Belief Network employed to relate various inputs with potential results. Additionally, wireless technology allows the user to monitor data remotely without a physical connection between the monitoring system and the client local area network.

Engineering systems analysis has been successfully applied to reliability calculations in related fields such as electronic devices. Mean-time-to-Failure (MTTF) data are collected on various components of a system. A designer then calculates system reliability based upon reliability block diagrams and produces an overall system reliability distribution, R. The dependence of R is a function of individual parameters of the system, $\lambda$, as described below:

$$R = f(\lambda_1, \lambda_2, \ldots \lambda_n)$$

Figure 1:
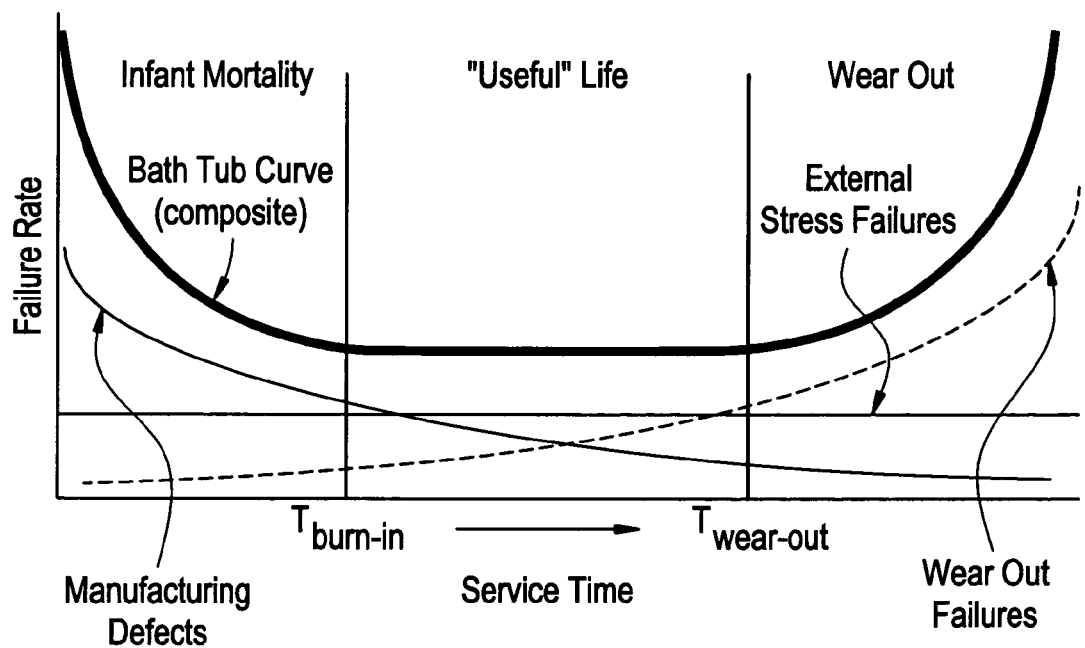
FIG. 1 is a graph illustrating the useful life span of a motor system part as a function of failure rate and time in service.

Each of the individual parameters $\lambda$, describes a failure rate of a corresponding component of the system. Each component of the system experiences a useful life that can be described in terms of a "bath tub" curve, see FIG. 1.

If failure rates of multiple components are independent, then a multiplicative relationship can be used to calculate system reliability:

$$p(\lambda) = \prod_{i=1}^{k} f(\lambda_i)$$

Otherwise a simulation of a joint, dependent probability density function (pdf) is required. The method is to randomly sample a joint pdf, compute a reliability for that run and then construct an overall reliability distribution function based on an accumulation of runs. Component life is distributed according to a probability density function and may take the form of an exponential, log-normal or Weibull distribution. The Weibull distribution is most useful due to its flexible shape parameters, $\eta$ and $\beta$:

$$f(t) = \frac{\beta}{\eta}\left(\frac{t}{\eta}\right)^{\beta-1} e^{-\left(\frac{t}{\eta}\right)^{\beta}}$$

Data for the individual Weibull distributions can be extracted from a database compiled from cataloged root cause failures for a variety of components. Conditional probabilities, of motor reliability are determined through a collection of field data of the system. In general, a conditional probability refers to the probability of event B happening, given that event A has already occurred. The collection of field data is accomplished, for example, using either online or offline methods of data collection.

Figure 2:
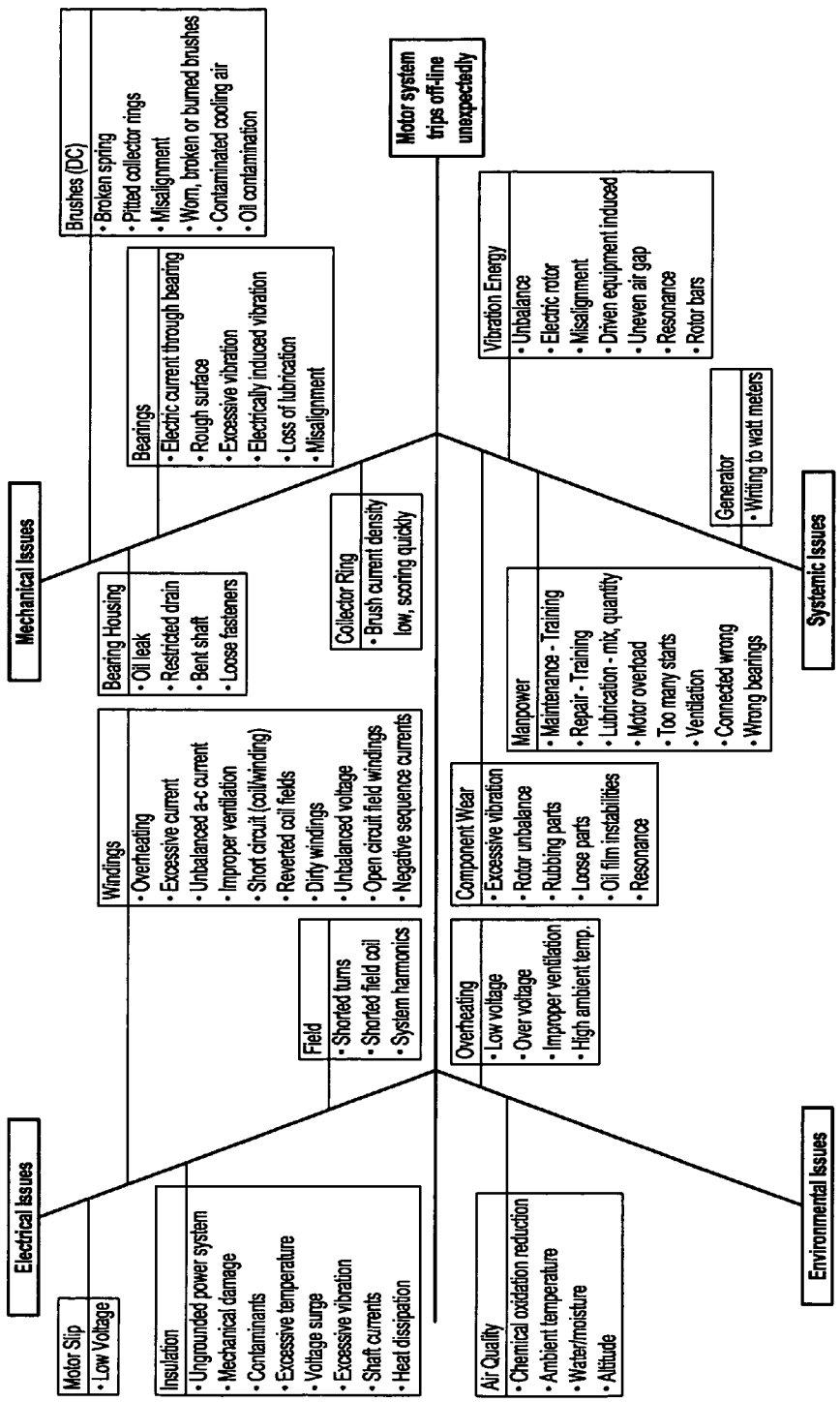
FIG. 2 is a fishbone diagram illustrating exemplary electrical, mechanical, environmental and systemic issues that may cause/contribute to motor system failure.

The fishbone diagram shown in FIG. 2 illustrates one example of a system fault-tree analysis that considers various factors and component failure modes, which may cause or contribute to an overall motor system failure. Known component failure modes and other causes/factors that have historically caused an electrical motor system or electrical generator to trip off-line unexpectedly (i.e., an operational shut-down of the system) are listed within one or more cause related subcategories. The subcategories are further organized according to more general fault issue classes/categories that are indicative, for example, of whether the cause of failure is related to systemic, environmental, electrical or mechanical issues. Preferably, the various component failure modes and causes of faults used in the system fault-tree analysis are developed from and based upon historical empirical data, tests and observations collected over a reasonable period of time from a plurality of motor systems.

Figure 3:
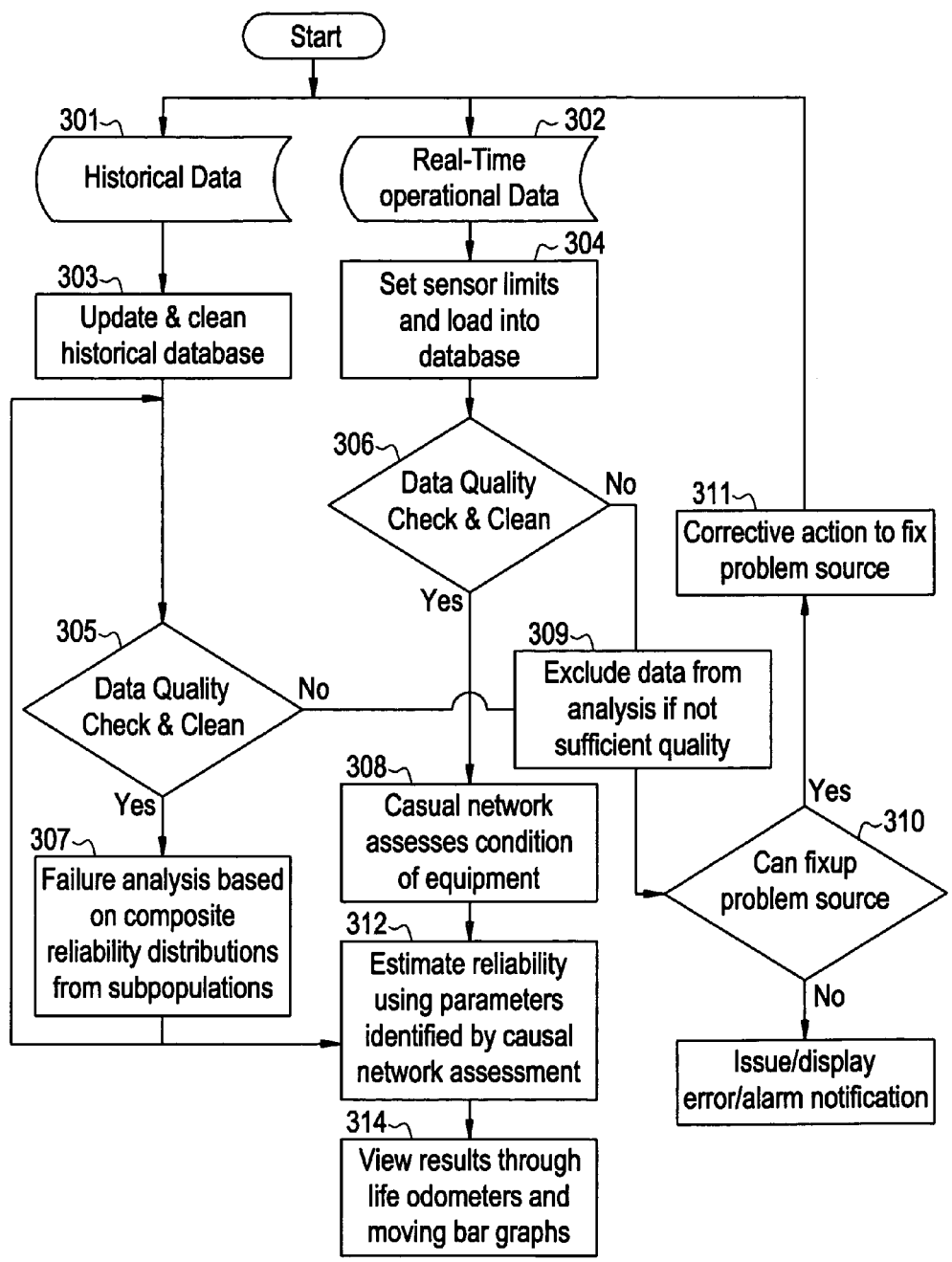
FIG. 3 is a high-level flow diagram illustrating general computer-implemented processes according to an exemplary embodiment of the present invention.

FIG. 3 shows a high level flow diagram illustrating the general computer-implemented processes of an example embodiment of the method of the present invention for determining motor reliability. The process initially involves acquiring and organizing historical motor repair data into a database at block 301. The historical motor repair data acquired at block 301 corresponds to a same or similar motor systems. At block 303, the database is updated and "cleaned" to remove any erroneous or irrelevant data. At block 305, data quality checking is performed and any data that does not meet a predetermined quality criterion is excluded from use in the current analysis at block 309. If a problem or source of poor quality data is identifiable at block 310, a notification or alarm may be provided and corrective action may be taken at block 311 before additional operational or historical data is acquired.

Assuming data quality is acceptable, failure analysis for the motor system is performed based on a composite of reliability distributions corresponding to various sub-populations of electrical, mechanical, environmental and systemic fault issues/failure modes. In addition, ongoing current operational parameter data is continually monitored and acquired at block 302 in real-time from sensors at the motor system for which a reliability and time-to-failure assessment is desired. The current operational parameter data is compiled in another database at block 302 (or integrated into the historical database) and continually updated. Specific data ranges and limits or calculated metrics for particular motor parameters may also be set and monitored in the database and used, for example, to trigger a notification/alarm condition when appropriate at block 304.

Data quality checks and data purging may also be performed at block 306. Assuming the data meets predetermined quality criterion, causal network analysis is performed to assess motor equipment condition that identifies likely developing failure modes at block 308 and then the results of reliability analysis from the historical data is integrated/combined and correlated with results from the casual network analysis and used to develop a statistically reliable prediction of time remaining before failure at block 312. In an exemplary embodiment, implementation includes computing the Maximum Likelihood Estimate (MLE) of Weibull reliability parameters for the system and/or the equipment components identified by the causal network. Computed statistical estimations of system reliability and time remaining before failure may be displayed using conventional computer I/O interface/display devices. In an exemplary embodiment, the time remaining before failure and computed reliability are displayed using dynamic graphical images such as moving bar graphs and changing data odometers at block 314.

In general, the various data validation and calibration procedures steps (e.g., 305 and 306) are not essential or required, but use of such tends to improve both failure analysis and causal networks relied upon for developing statistical predictions of reliability.

Figure 4:
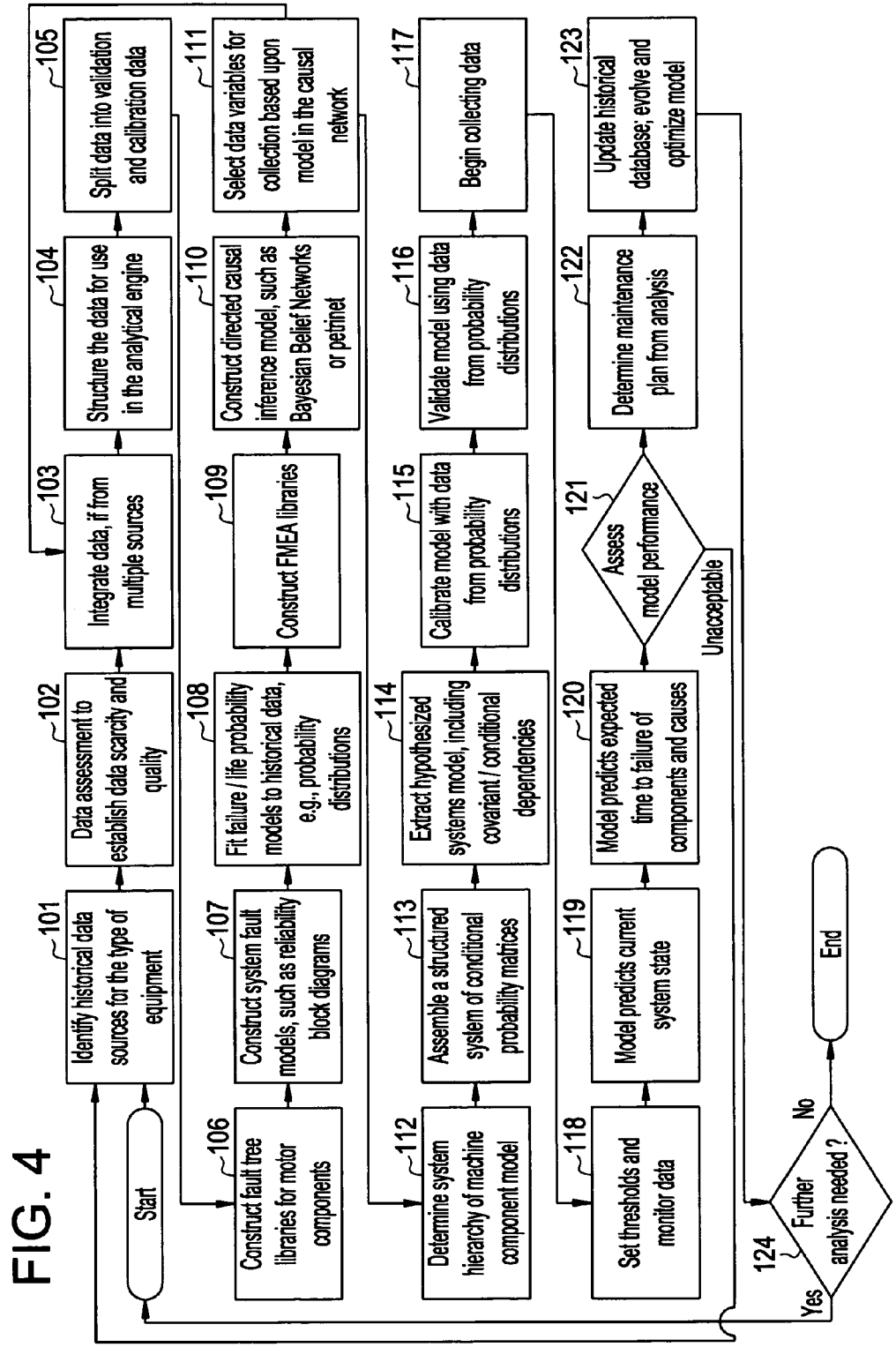
FIG. 4 is a detailed flow diagram illustrating computer-implemented processes according to an exemplary embodiment of the present invention.

FIG. 4 provides a more detailed procedural flow diagram that illustrates an exemplary process for computing motor reliability and predicting time-to-next-repair (or failure). Initially, as indicated at block 101, historical data sources such as, for example, historical test data and/or failure analysis records acquired over a period of time for the type of motor equipment system being evaluated are identified and a historical database of part/component failure rate data is compiled. In an exemplary embodiment, the historical database is maintained and motor reliability computations are performed on a computer system that is remote from the motor system site (see FIG. 5). The historical database may also be updated by manual data transfer means using, for example, conventional removable storage media (e.g., CD ROM).

Procedural blocks 102 through 111 of FIG. 4 represent general data preprocessing steps performed to structure and combine historical motor data used later for reliability computations. For example, historical data sources for the particular type of system/equipment analyzed are first identified at block 101 and data is assessed to determine scarcity and quality of parts at block 102. The historical data is integrated if acquired from multiple sources at block 103 and structured for use by the analytical engine at block 104. Data is split into validation and calibration type data at block 105 and fault tree libraries are constructed for the various motor system components at block 106. Next, system fault models (e.g., reliability block diagrams) are constructed at block 107 and the failure/life-span probability models are fit to the historical data (e.g., using probability distribution) at block 108. At block 109, the construction of Failure Modes and Effects Analysis (FMEA) libraries is performed to identify common failure modes and to assist in construction of causal networks used to compute conditional probability of motor component degradation. A directed causal inference model, such as Bayesian Belief Networks, is constructed at block 110 and data variables are selected for collection based upon the model used in the causal network at block 111.

Blocks 112 through 114 of FIG. 4 illustrate procedural steps for segmenting the motor system by component and establishing dependencies within the causal network. For example, a system hierarchy of the machine component model is determined at block 112, a structured system of conditional probability matrices is assembled at block 113 and a hypothesized systems model including covariant/ conditional dependencies is extracted at block 114. Next, in procedural blocks 115 and 116, the systems model is properly calibrated with respect to the motor system under investigation. For example, the systems model is calibrated with data from probability distributions at block 115 and then validated using data from probability distributions at block 116.

Block 117 of FIG. 4 represents the initiation of a procedural stage of field data collection from the sensors and systems that are attached to a particular motor system under analysis. At this point, current operational/test data is obtained and/or collected directly at/from the particular motor system under analysis and forwarded via wireline or wireless communications link to a remote computer system, which performs the analysis. This field data may be collected from sensors on the motor or other conventional means at the motor system site. As illustrated in the following procedural block 118, motor system thresholds and alarm limits are constructed/set-up and the field data from the motor system is monitored. If set thresholds or alarm limits are exceeded, some form of real-time feedback, e.g., an alarm notification, is immediately provided to a monitoring data analyst. Next, as illustrated in procedural block 119, the "state" of the motor system is computed based on the causal network, the thresholds and the monitor data acquired at block 118. The expected time-to-failure and expected failure cause of the various motor system components are then predicted at block 120 using the system model including covariant/conditional dependencies.

Next, as illustrated in FIG. 4 by procedural blocks 121 and 122, decision points are reached whereby a monitoring data analyst will have to evaluate any alarm conditions and/or assess the model's performance and also make decisions to repair or to replace components (e.g., develop a maintenance plan) in light of considering relevant economic trade-offs and cost optimization goals. If it appears that the system model is inaccurate or unrealistic, the whole process may need to be re-initiated at block 101 and further historical data acquired to improve predictions. In this regard, procedural blocks 123 and 124 illustrate further steps, which may be taken to improve the predicting capabilities of the causal networks and optimize the reliability model.

Figure 5:
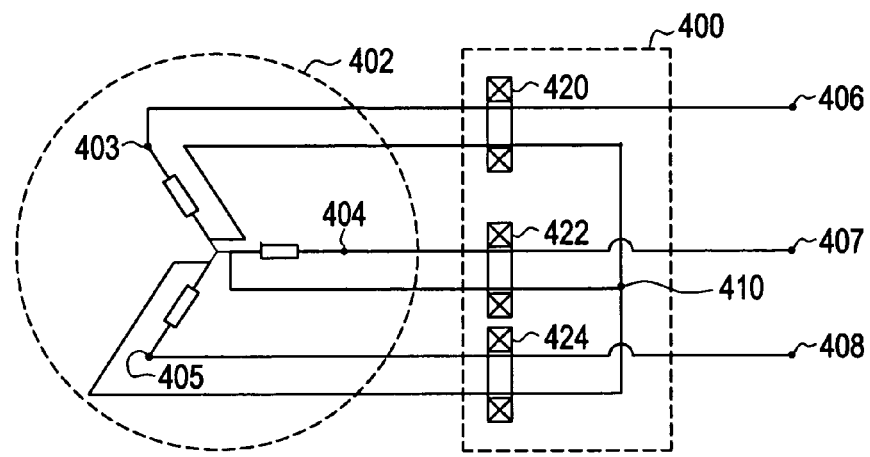
FIG. 5 illustrates a schematic view of an exemplary sensor configured to acquire field data according to an exemplary embodiment of the present invention.
Figure 6:
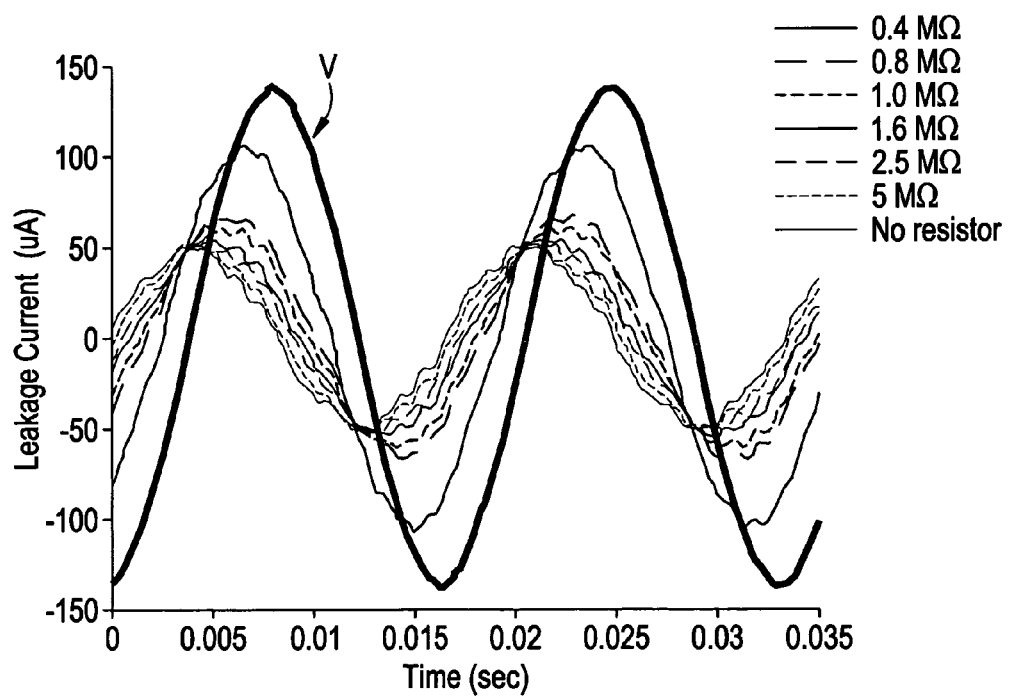
FIG. 6 is a waveform diagram of leakage current measured by the exemplary sensor of FIG. 5.

FIG. 5 illustrates a schematic view of an exemplary sensor configured to acquire field data according to an exemplary embodiment of the present invention. FIG. 6 is a waveform diagram of leakage current measured by the exemplary sensor of FIG. 5.

Referring to FIGS. 5 and 6, the sensor is a "tan delta" sensor assembly 400. The tan delta sensor assembly 400 may be used to acquire field data from either alternating current (AC) machine 402 including a motor or a generator. Although the AC machine 402 may be a generator, the following description relates to an AC machine 402 that is a motor. In an exemplary embodiment, the AC machine 402 includes three phase windings, a first phase winding 403, a second phase winding 404 and a third phase winding 405. A phase voltage is applied to each of the first, second and third phase windings 403, 404 and 405 via a corresponding first input terminal 406, second input terminal 407 and third input terminal 408, respectively. An output terminal of each of the first, second and third phase windings 403, 404 and 405 is connected to a common or a neutral node 410.

The tan delta sensor assembly 400 is disposed proximate to the AC machine 402 to measure the leakage current. The tan delta sensor includes a first current transformer 420, a second current transformer 422, and a third current transformer 424. First, second and third current transformers 420, 422 and 424 may be differential current transformers. In an exemplary embodiment, first, second and third current transformers 420, 422 and 424 are donut or annular shaped current transformers that are disposed proximate to the AC machine 402 such that conductors carrying both a supply current and a return current are passed through a center portion of each annular shaped current transformer. Due to an arrangement of the first, second and third current transformers 420, 422 and 424 supply and return currents tend to cancel each other out. Thus, the first, second and third current transformers 420, 422 and 424 measure a difference between the supply and return currents. The difference between the supply and return currents is the leakage current.

As shown in FIG. 6, the phase and amplitude of leakage currents may be measured. A particular phase voltage, or reference voltage V, is illustrated. Various leakage currents are also illustrated. Each leakage current corresponds to a particular winding resistance value. Changes in amplitude of the leakage current indicate changes in a resistance value of a phase winding being examined. Phase shifts are also visible as temporal shifts of leakage current waveforms. Phase shifts indicate changes in an impedance value of a phase winding being examined. As winding insulation breaks down over time, corresponding changes in phase and amplitude of leakage currents are detectable using the tan delta sensor assembly 400. Historical leakage current data may be compared to current leakage current data using the method for determining motor reliability as discussed above referring to FIGS. 3 and 4, to aid in prediction of insulation breakdown caused by thermal, electrical, ambient and mechanical stress.

Figure 7:
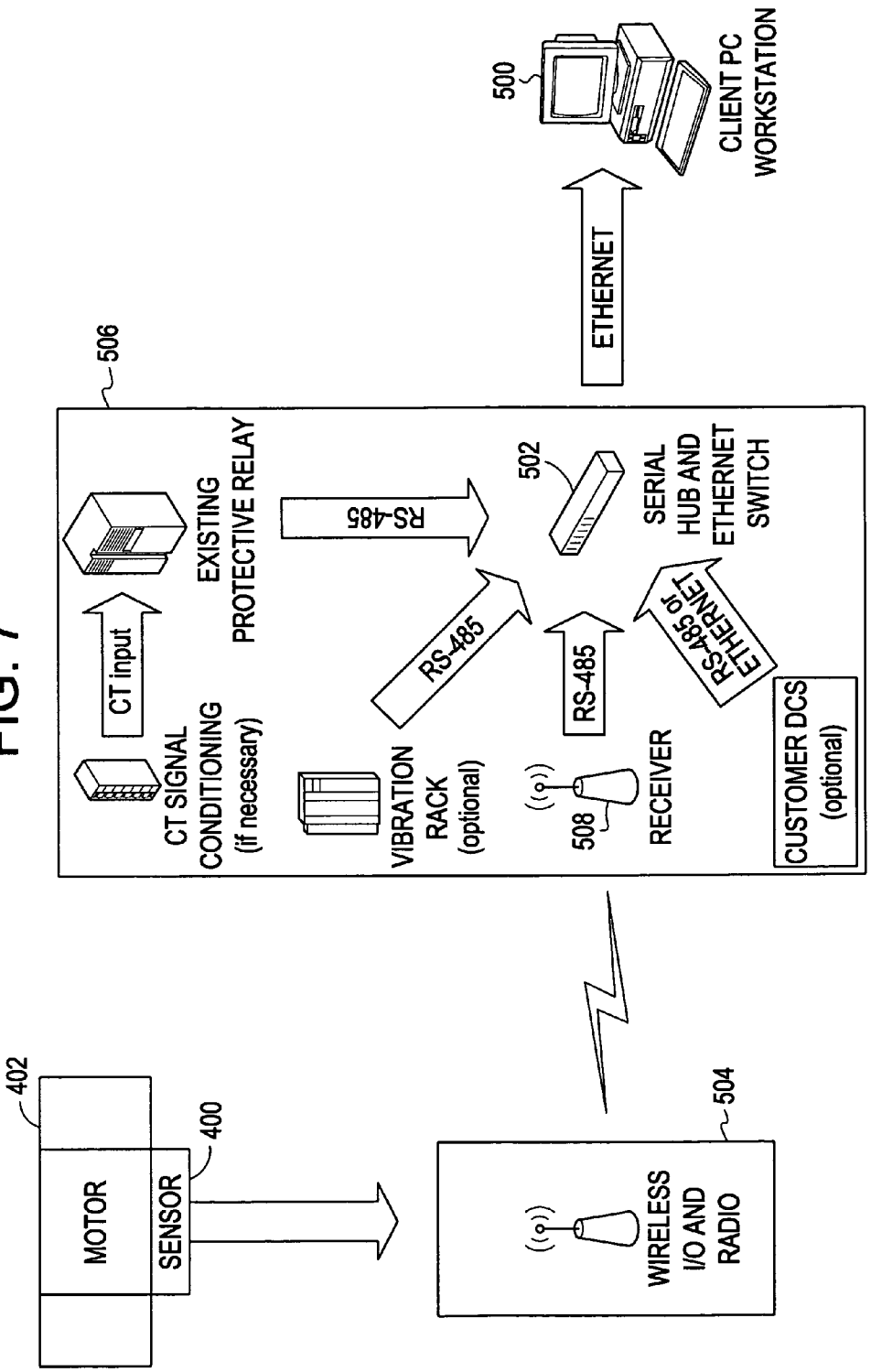
FIG. 7 illustrates a wireless motor diagnostic system according to an exemplary embodiment of the present invention.

FIG. 7 illustrates a wireless motor diagnostic system in which the method of the present invention may be implemented. In this embodiment, a remote diagnostic computer system 500 for hosting a database of motor system failure rate information (historical database) and for computing motor reliability according to the method of the present invention is coupled to motor sensors located at the motor system site via a landline or wireless communications network. The computer system 500 may be, but is not limited to, a client personal computer (PC) workstation, which may or may not be connected to a network. The computer system 500 may be, for example, any suitable processing circuit capable of executing instructions stored in a storage medium. The computer system 500 receives data from an access point 502, which may be a serial hub or an Ethernet switch, for example. The access point 502 may be located in a motor control and protection cabinet 506, which relays data from a transmitter 504. Transmitter 504 is in communication with the motor sensors and receives the data from the motor sensors, which may include a tan delta sensor assembly 400. The tan delta sensor assembly 400 is disposed proximate to the AC machine 402 and senses data, which is acquired and transmitted by the transmitter 504 to a receiver 508 disposed in the motor control and protection cabinet 506. The motor control and protection cabinet 506 may include other protective devices capable of transmitting data to the computer system 500, such as, for example, a vibration rack or existing protective relays. In an exemplary embodiment, wireless communication via the transmitter 504 and the receiver 508 is provided using IEEE 802.11 b standards and extensible authentication protocol, which provides security via authentication and encryption. A variety of antennas and adapters are selectable based on site conditions. For example, if a site contains obstacles to transmission, a higher gain antenna, a directional antenna, or repeaters are used as necessary. Alternatively, the computer system 500 may be located at the AC machine 402 and thus eliminate a need to transmit data. The computer system 500 includes a storage medium and a processing circuit.

The present invention may also be embodied in the form of computer program code containing instructions embodied in tangible media, such as floppy diskettes, CD-ROMs, hard drives, or any other computer readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium or network, such as over electrical wiring or cabling, through fiber optics, or via electromagnetic radiation, wherein when the computer program code is loaded into and executed by a computer, the computer becomes an apparatus for practicing the invention. When implemented on a general-purpose microprocessor, the computer program code segments configure the microprocessor to create specific logic circuits. The technical effect of the executable instructions is to perform the method for determining motor reliability as discussed above referring to FIGS. 3 and 4, where the tan delta sensor assembly 400 is one sensor used to acquire data.

In addition, while the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. A method for determining a remaining time before failure of a monitor system, the method comprising:
   acquiring historical motor data associated with the motor system, in a computer;
   obtaining operational parameter data from a tan delta sensor operably coupled to the motor system;
   uploading the operational parameter data to the computer;
   performing failure analysis based on a composite of reliability probability distributions corresponding to predetermined sub-populations of historical motor system failure causes indicated in the historical motor data;
   developing a causal network for modeling reliability of one or more motor system components, and assessing motor system component condition based on the causal network and the operational parameter data; and
   performing an integrated casual network and reliability analysis of the motor system, wherein results from the performing failure analysis are intergrated with results from the assessing motor system component condition based on the causal network to compute a quantitive value for the time remaining before failure of the motor system with an ascertained statistical confidence; and
   displaying the quantitative value for the time remaining before failure of the motor system on a display device.

2. The method of claim 1, wherein the developing the causal network includes developing a Bayesian Belief Network.

3. The method of claim 1, wherein the performing failure analysis comprise modeling a failure rate of a system component using a Weibull probability distribution function.

4. The method of claim 1, wherein the obtaining operational parameter data comprises obtaining leakage current data.

5. The method of claim 4, wherein the obtaining leakage current data comprises at least one of:
   obtaining leakage current phase data; and
   obtaining leakage current amplitude data.

6. The method of claim 4, wherein the obtaining leakage current data further comprises obtaining leakage current data using the tan delta sensor.

7. The method of claim 4, further comprising predicting insulation degradation responsive to the leakage current data.

8. The method of claim 1, wherein displaying the remaining time before failure of the motor system comprises displaying the remaining time befor failure of the motor system as a moving bar-graph on a graphical user interface of the display device.

9. The method of claim 1, further comprising transmitting the operational parameter data from the tan delta sensor to the computer via a wireless network.

10. The method of claim 1, wherein the performing failure analysis further comprises predicting insulation degradation of a motor system component responsive to leakage current data measured at the motor system.

11. A system for determining a remaining time before failure of a motor system, the system comprising:
   a tan delta sensor disposed in electrical communication with the motor system to access data of the motor system;
   a computer comprising:
      a storage medium, readable by a processing circuit, storing instructions for execution by the processing circuit for:
         acquiring historical motor data associated with the motor system;
         obtaining operational parameter data from the tan delta sensor;
         performing failure analysis based on a composite of reliability probability distributions corresponding to predetermined sub-populations of historical motor system failure causes indicated in the historical motor data;
         developing a causal network for modeling reliability of one or more motor system components and assessing motor system component condition based on the causal network;
         performing an integrated causal network and reliability analysis of the motor system, wherein results from the performing failure analysis are integrated with resluts from the assessing motor system component condition based on the casual network to compute a quantitative value for the time remaining before failure of the motor system with an ascertained statistical confidence; and displaying the quantitative value for the time remaining before failure of the motor system on a display device; and a transmission network in communication with the computer and the tan delta sensor configured to communicate the data from the tan delta sensor to the computer.

12. The system of claim 11, wherein the transmission network comprises:

a transmitter receptive of the data and transmitting the data;

a receiver in communication with the transmitter to receive the data;

an access point in communication with the receiver and the computer to relay the data to the computer.

13. The system of claim 12, wherein the receiver and transmitter are wireless devices.

14. The system of claim 11, wherein the tan delta sensor obtains leakage current data of the motor system, and the leakage current data includes at least one of:

leakage current phase data; and leakage current amplitude data.

15. A method for determining remaining time before failure of a motor system, comprising:

acquiring historical motor data associated with the motor system;

obtaining operational parameter data from a tan delta sensor operably coupled to the motor system;

performing a failure analysis associated with with the motor system utilizing the historical motor data;

assessing a motor system component condition utilizing a causal network associated with the motor system and the operational parameter data; calculating a quantitative value for a time remaining before failure of the motor system based on results from the failure analysis and the motor system component condition; and displaying a representation of the quantitative value for the time remaining before failure of the motor system on a display device.

16. The method of clain 15, wherein the representation of the quantitative value is a bar graph.

* * * * *

UNITED STATES PATENT AND TRADEMARK OFFICE
CERTIFICATE OF CORRECTION

PATENT NO. : 7,254,514 B2  
APPLICATION NO. : 10/908455  
DATED : August 7, 2007  
INVENTOR(S) : Michael Brynn House et al.

Page 1 of 1

It is certified that error appears in the above-identified patent and that said Letters Patent is hereby corrected as shown below:

Drawing Sheet 3:
Figure 3, Item 308, before "network", delete "casual" and insert therefor --causal--;

Column 3:
Line 25, after "circuit", delete "foracquiring" and insert therefor --for acquiring--;

Column 6:
Line 4, before "network", delete "casual" and insert therefor --causal--;

Column 9:
Line 62, after "integrated", delete "casual" and insert therefor --causal--;

Column 10:
Line 26, after "time", delete "casual" and insert therefor --causal--;

Line 64, after "the", delete "casual" and insert therefor --causal--.

Signed and Sealed this

Fifteenth Day of July, 2008

JON W. DUDAS  
*Director of the United States Patent and Trademark Office*